United States Patent
Shah et al.

(10) Patent No.: US 12,272,427 B2
(45) Date of Patent: Apr. 8, 2025

(54) SEMICONDUCTOR DEVICE INCLUDING FIRST AND SECOND CLOCK GENERATORS

(71) Applicant: Taiwan Semiconductor Manufacturing Company, Ltd., Hsinchu (TW)

(72) Inventors: Jaspal Singh Shah, Ottawa (CA); Sahil Preet Singh, Bangalore (IN); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 407 days.

(21) Appl. No.: 17/741,637

(22) Filed: May 11, 2022

(65) Prior Publication Data

US 2023/0035927 A1    Feb. 2, 2023

Related U.S. Application Data (60) Provisional application No. 63/226,863, filed on Jul. 29, 2021.

(51) Int. Cl.
| | |
|---|---|
| *G11C 7/00* | (2006.01) |
| *G11C 7/22* | (2006.01) |
| *G11C 11/412* | (2006.01) |

(52) U.S. Cl.
CPC ............ *G11C 7/222* (2013.01); *G11C 11/412* (2013.01)

(58) Field of Classification Search
CPC ....... H03L 7/00; G11C 7/1039; G11C 7/1051; G11C 7/1066; G11C 7/22; G11C 7/1072; G11C 7/106; G11C 7/222; G11C 11/4076; G11C 11/4096; G11C 16/26; G11C 2207/107; G11C 5/066; G11C 7/1033; G11C 7/1087; G11C 7/1078; G11C 7/109;
(Continued)

(56) References Cited

U.S. PATENT DOCUMENTS

| | | | |
|---|---|---|---|
| 5,386,391 A | 1/1995 | Watanabe | |
| 5,812,490 A * | 9/1998 | Tsukude | G11C 7/22 |
| | | | 365/230.03 |

(Continued)

FOREIGN PATENT DOCUMENTS

TW    201810540    3/2018

OTHER PUBLICATIONS

Taiwan Notice of Allowance; Application No. 111126475; Dated Jul. 5, 2023.

*Primary Examiner* — Thong Q Le
(74) *Attorney, Agent, or Firm* — Jones Day (57) ABSTRACT

A semiconductor device includes a memory bank and first and second clock generators. The first clock generator includes a first transistor configured to receive an external clock signal. The first clock generator is configured to generate a global clock signal that is based on the external clock signal and that controls writing to and reading from the memory bank. The second clock generator includes a first transistor configured to receive the external clock signal. The second clock generator is configured to generate a pipeline clock signal that is based on the external clock signal and that controls a pipeline operation of reading from the memory bank. Methods of operating the first and second clock generators are also disclosed.

20 Claims, 7 Drawing Sheets

(58) Field of Classification Search
CPC ... G11C 7/1093; G11C 11/412; G11C 11/419; G11C 7/1018; G11C 7/1057; G11C 7/225
See application file for complete search history.

(56) References Cited

U.S. PATENT DOCUMENTS

2004/0120212 A1 6/2004 Ooishi
2018/0267877 A1 9/2018 Kwon et al.

* cited by examiner

FIG. 7

SEMICONDUCTOR DEVICE INCLUDING FIRST AND SECOND CLOCK GENERATORS

PRIORITY CLAIM

This application claims priority to U.S. Provisional Application No. 63/226,863, filed Jul. 29, 2021, the contents of which are incorporated herein by reference in its entirety.

BACKGROUND

A semiconductor device includes a plurality of memory banks. Each memory bank includes a plurality of memory arrays. Each memory array includes a plurality of bit cells. A write operation may be performed on the bit cells to store bits of data therein. A read operation may be performed on the bit cells to retrieve bits of data therefrom.

BRIEF DESCRIPTION OF THE DRAWINGS

Aspects of the present disclosure are best understood from the following detailed description when read with the accompanying figures.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In memory systems, speed of operation is often a substantial design objective, and is sometimes a primary objective. Write and read operations may be sources of delay in the operation of a memory system. In certain systems and methods as described herein, write and read operations may be performed using pipeline techniques so as to increase throughput. In a pipeline technique, instead of waiting execution for a current instruction to be completed before fetching an instruction to be executed next, a next instruction is fetched while a current instruction is being executed. That is, a pipeline technique fetches and executes instructions simultaneously.

Figure 1:
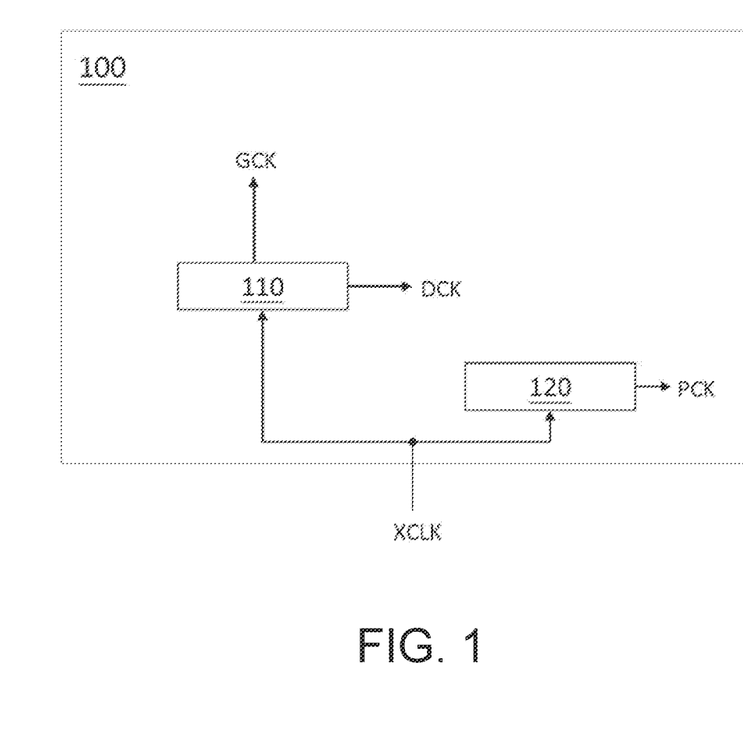
FIG. 1 is a schematic diagram illustrating an exemplary semiconductor device in accordance with various embodiments of the present disclosure.
Figure 2:
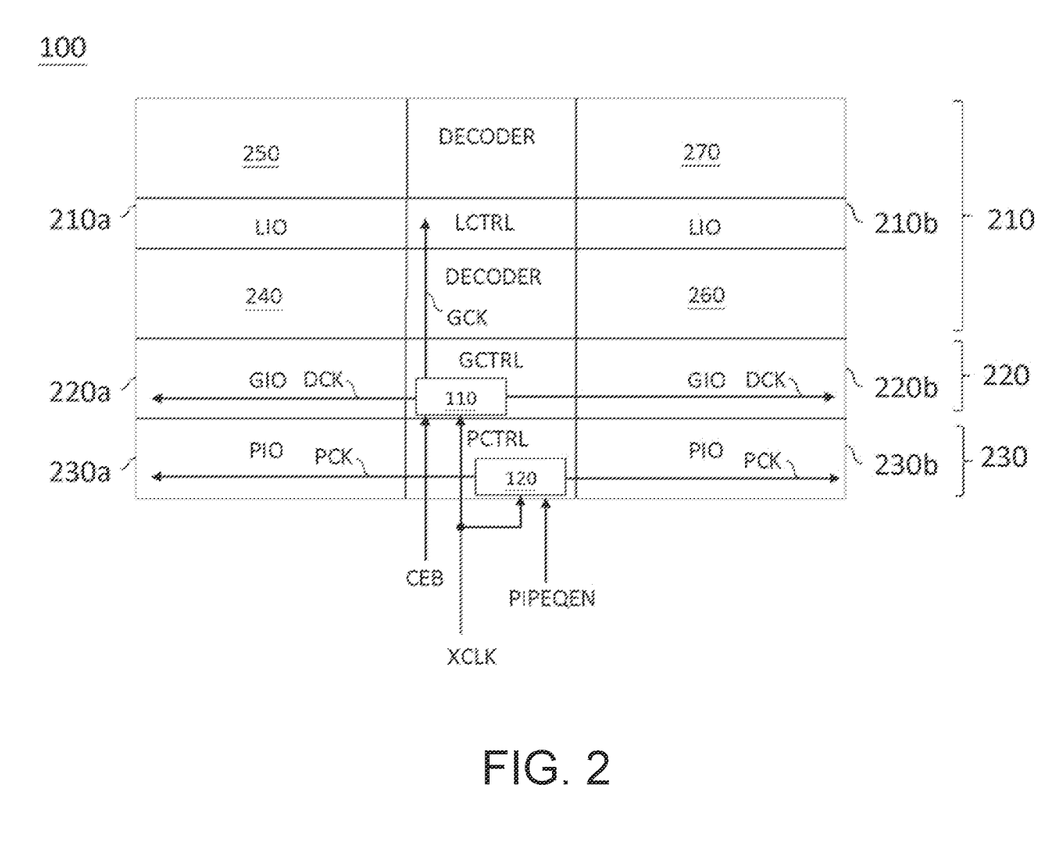
FIG. 2 is a schematic diagram illustrating a more detailed exemplary semiconductor device in accordance with various embodiments of the present disclosure.

In an exemplary embodiment, a semiconductor device, e.g., semiconductor device 100 shown in FIG. 1, includes one or more memory banks, e.g., memory bank 210 shown in FIG. 2. The memory bank 210 includes a plurality of memory arrays, e.g., memory arrays 240-270 shown in FIG. 2. Each memory array 240-270 includes a plurality of bit cells, e.g., bit cell 300 shown in FIG. 3. A write operation may be performed on the bit cells 300 to store bits of data therein. A read operation may be performed on the bit cells 300 to retrieve bits of data therefrom. Instructions associated with write and read operations may be pipelined to increase throughput of the semiconductor device 100. In certain scenarios, the semiconductor device 100 may include a single clock generator that generates clock signals for use in synchronizing the read, write, and pipeline operations. In certain scenarios, a pipeline architecture may actually perform slower than a non-pipelined architecture in performing certain operations. For example, when a pipeline operation other than a read or a write is being performed, a significant timing penalty may be incurred while the non-read operation traverses the pipeline. Such a timing penalty may include an increase in a duration of a setup/hold time, which may in turn results in an increase in a duration of a clock low time.

Systems and methods, in certain embodiments, as described herein provide a semiconductor device 100 that includes separate clock generators for writing, reading, and pipelining operations. For example, the semiconductor device 100 includes a first clock generator 110 dedicated to controlling write and read operations on the memory arrays and a second clock generator 120 dedicated to controlling a pipeline operation on instructions for the memory arrays. Therefore, the first and second clock generators 110, 120 may be enabled/disabled independently of each other. As a result, during a pipeline operation without write and read operations, i.e., when the first clock generator 110 is disabled and the second clock generator 110 is enabled, a duration of a setup/hold time, as well as a duration of a clock low time, of the semiconductor device 100 of the present disclosure may be reduced, e.g., for more than 30%, as compared to conventional semiconductor devices.

In further detail, FIG. 1 is a schematic diagram illustrating an exemplary semiconductor device 100 in accordance with various embodiments of the present disclosure. As illustrated in FIG. 1, the semiconductor device 100, e.g., a static random access memory (SRAM) device, a dynamic random access memory (DRAM) device, or any suitable memory device, includes one or more memory banks, e.g., memory bank 210 shown in FIG. 2. The memory bank 210 includes a plurality of memory arrays, e.g., memory arrays 240-270. Each memory array 240-270 includes a plurality of bit cells, e.g., bit cell 300 shown in FIG. 3. A write operation may be performed on the bit cells 300 to store bits of data therein. A read operation may be performed on the bit cells 300 to retrieve bits of data therefrom. Instructions associated with write and read operations may be pipelined to increase throughput of the semiconductor device 100.

The semiconductor device 100 further includes a first clock generator 110 and a second clock generator 120 separate from the first clock generator 110. The first clock generator 110 is configured to receive an external clock signal (XCLK), e.g., from auxiliary circuitry external to the semiconductor device 100, and to generate a global clock signal (GCK) based on the external clock signal (XCLK). The global clock signal (GCK) controls writing to and reading from the bit cells 300. The first clock generator 110 is further configured to generate a data clock signal (DCK) based on the external clock signal (XCLK). The data clock signal (DCK) controls transfer of data in and out of the semiconductor device 100, e.g., between the bit cells 300 and auxiliary circuitry external to the semiconductor device 100.

The second clock generator 120 is configured to receive the external clock signal (XCLK) and to generate a pipeline clock signal (PCK) based on the external clock signal (XCLK). The pipeline clock signal (PCK) controls pipelining of instructions for the bit cells 300.

FIG. 2 is a schematic diagram illustrating a more detailed exemplary semiconductor device 100 in accordance with various embodiments of the present disclosure. As illustrated in FIG. 2, the semiconductor device 100 includes a plurality of memory banks (only one of the memory banks 210 is shown in FIG. 2), a global control circuit 220, and a pipeline control circuit 230. In an alternative embodiment, the semiconductor device 100 includes a single memory bank. The memory bank 210 includes a plurality of memory arrays (e.g., memory array 240, memory array 250 above the memory array 240, memory array 260 at the right side of the memory array 240, and memory array 270 above the memory array 260 and at the right side of the memory array 250). Each memory array 240-270 includes a plurality of bit cells, e.g., bit cell 300 shown in FIG. 3. The bit cells 300 may be arranged in an array of rows and columns. The bit cells 300 in each column are connected between a respective bit line and a respective complement bit line. The bit cells 300 in each row are connected to a respective word line.

Although the memory bank 210 is exemplified with four memory arrays 240-270, it is understood that, after reading this disclosure, the number of memory arrays of the memory bank 210 may be increased or decreased as required.

The memory bank 210 further includes a local control circuit that has a left local input and output (LIO), a right LIO, and a local controller (LCTRL) between the left and right LIOs. The local control circuit further has left and right edges 210a, 210b that isolate the left and right LIOs and the local controller (LCTRL) from auxiliary circuitry external to the semiconductor device 100.

As illustrated in FIG. 2, the memory bank 210 further includes a lower address decoder below the local controller (LCTRL) and between the memory arrays 240, 260 and an upper address decoder above the local controller (LCTRL) and between the memory arrays 250, 270.

The global control circuit 220 includes a left global input and output (GIO), a right GIO, and a global controller (GCTRL) between the left and right GIOs. The global control circuit 220 has left and right edges 220a, 220b that isolate the left and right GIOs and the global controller (GCTRL) from auxiliary circuitry external to the semiconductor device 100.

The global control circuit 220 is formed with a first clock generator 110 that receives a chip enable signal (CEB), e.g., from auxiliary circuitry external to the semiconductor device 100, and an external clock signal (XCLK), e.g., from auxiliary circuitry external to the semiconductor device 100. When the first clock generator 110 is enabled, e.g., when the chip enable signal (CEB) transitions from a low logical level to a high logical level, the first clock generator 110 generates a global clock signal (GCK) and a data clock signal (DCK) based on the external clock signal (XCLK). In an alternative embodiment, the first clock generator 110 is enabled when the chip enable signal (CEB) transitions from a high logical level to a low logical level.

The pipeline control circuit 230 includes a left pipeline input and output (PIO), a right PIO, and a pipeline controller (PCTRL) between the left and right PIOs. The pipeline control circuit 230 has left and right edges 230a, 230b that isolate the left and right PIOs and the local controller (LCTRL) from auxiliary circuitry external to the semiconductor device 100.

The pipeline control circuit 230 is formed with a second clock generator 120 that receives a chip enable signal (PIPEQEN), e.g., from auxiliary circuitry external to the semiconductor device 100, and the external clock signal (XCLK). When the second clock generator 120 is enabled, e.g., when the chip enable signal (PIPEQEN) transitions from a low logical level to a high logical level, the second clock generator 120 generates a pipeline clock signal (PCK) based on the external clock signal (XCLK). In an alternative embodiment, the second clock generator 120 is enabled when the chip enable signal (PIPEQEN) transitions from a high logical level to a low logical level.

From the above, the first and second clock generators 110, 120 are separate from each other. As such, the first clock generator 110 may be enabled or disabled, i.e., through the chip enable signal (CEB), to generate a global clock signal (GCK) and a data clock signal (DCK) independent of the chip enable signal (PIPEQEN), i.e., regardless of whether the chip enable signal (PIPEQEN) has a high logical level or a low logical level. Likewise, the second clock generator 120 may be enabled or disabled, i.e., through the chip enable signal (PIPEQEN), to generate the pipeline clock signal (PCK) independent of the chip enable signal (CEB), i.e., regardless of whether the chip enable signal (CEB) has a high logical level or a low logical level.

Figure 3:
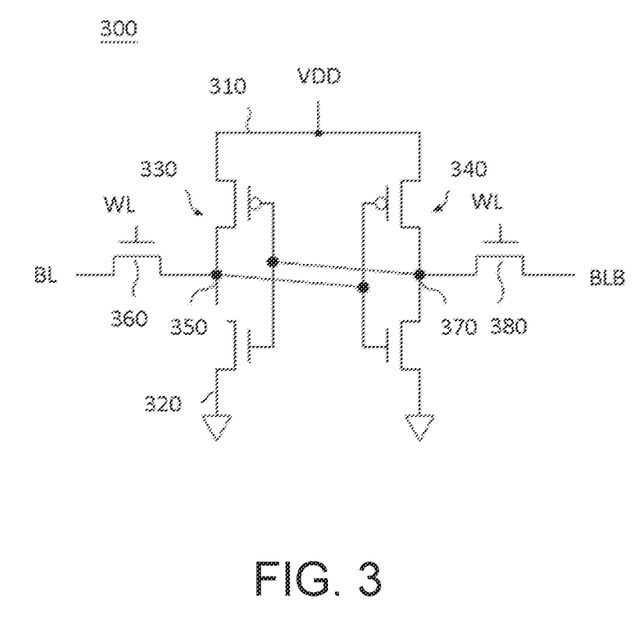
FIG. 3 is a schematic diagram illustrating an exemplary bit cell in accordance with various embodiments of the present disclosure.

Example supporting the circuitry for the bit cell 300 are depicted in FIG. 3. It is understood that these circuitries are provided by way of example, not by limitation, and other suitable bit cell 300 circuitry are within the scope of the present disclosure. FIG. 3 is a schematic diagram illustrating an exemplary bit cell 300 in accordance with various embodiments of the present disclosure. As illustrated in FIG. 3, the example bit cell 300 is a 6 T bit cell and includes a pair of P-type Metal Oxide Semiconductor (PMOS) transistors and two pairs of N-type Metal Oxide Semiconductor (NMOS) transistors. The example bit cell 300 further includes a first supply voltage node 310 configured to receive a supply voltage (VDD) and a second supply node 320 connected to an electrical ground or configured to receive a negative supply voltage. A pair of cross-coupled inverters 330, 340 are connected between the supply voltage nodes 310, 320. Each of the inverters 330, 340 includes a PMOS transistor and an NMOS transistor. A data node 350 is connected between an output of the cross-coupled inverter 330 and a pass transistor 360. A complement data node 370 is connected between an output of the cross-coupled inverter 340 and a pass transistor 380. The pass transistors 360, 380 are connected to a word line (WL). A bit line (BL) is connected to the data node 350 through the pass transistor 360. A complement bit line (BLB) is connected to the complement data node 370 through the pass transistor 380.

A write operation may be performed on the bit cell 300 by asserting a high logical level on the word line (WL) and a data bit that has a low/high logical level on the bit line (BL). The data bit on the bit line (BL) is latched through the pass transistor 360 and is stored at the storage node 350. A read operation may be performed on the bit cell 300 by detecting the data bit stored at the storage node 350, e.g., through a read port of the semiconductor device 100.

Figure 4:
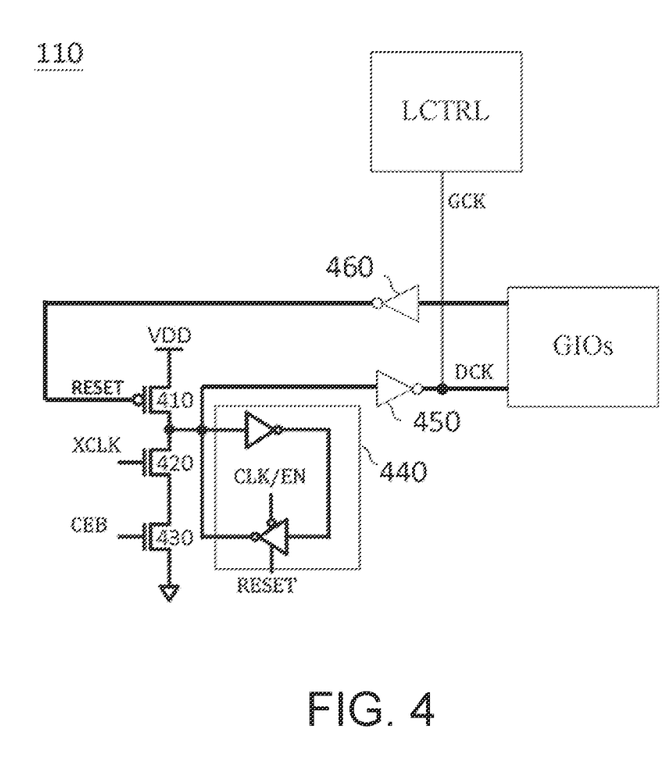
FIG. 4 is a schematic diagram illustrating an exemplary first clock generator in accordance with various embodiments of the present disclosure.

Example supporting circuitry for the first clock generator 110 are depicted in FIG. 4. It is understood that these circuitries are provided by way of example, not by limitation, and other suitable first clock generator 110 circuitry are within the scope of the present disclosure. FIG. 4 is a schematic diagram illustrating an exemplary first clock generator 110 in accordance with various embodiments of the present disclosure. As illustrated in FIG. 4, the example first clock generator 110 includes a PMOS transistor 410, a pair of NMOS transistor 420, 430, a buffer and latch circuit 440, and a pair of inverters 450, 460. The transistors 410-430 are connected between the supply voltage nodes 310, 320.

The buffer and latch circuit 440 is connected to a node between the transistors 410, 420 and to the input of the inverter 450. The output of the inverter 450 is connected to the left and right GIOs and the local controller (LCTRL). The input of the inverter 460 is connected to the left and right GIOs. The buffer and latch circuit 440 has a reset terminal that receives a reset signal. The buffer and latch circuit 440 further has a chip enable terminal that receives an enable signal and a clock terminal that receives a clock signal. The operation of the first clock generator 110 will be described below with respect to FIG. 5.

In some embodiments, at least one of the inverters 450, 460 is formed in the global controller (GCTRL). In other embodiments, at least one of the inverters 450, 460 is formed at the edge 220a and/or the edge 220b of the global control circuit 220.

Figure 5:
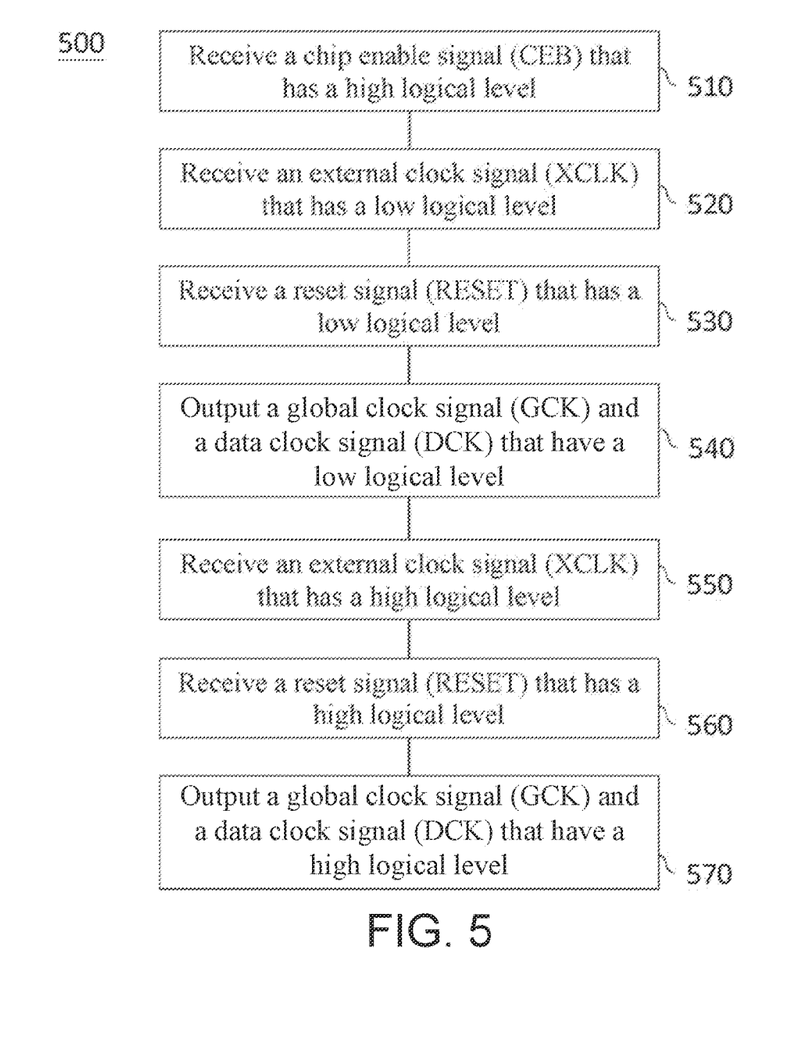
FIG. 5 is a flow chart illustrating an exemplary method of operating a first clock generator in accordance with various embodiments of the present disclosure.

FIG. 5 is a flow chart illustrating an exemplary method 500 of operating the first clock generator 110 in accordance with various embodiments of the present disclosure. Method 500 will now be described with further reference to FIGS. 2-4 for ease of understanding. It is understood that method 500 is applicable to structures other than those of FIGS. 2-4. Further, it is understood that additional operations can be provided before, during, and after method 500, and some of the operations described below can be replaced or eliminated, in an alternative embodiment of method 500.

In operation 510, with further reference to FIG. 4, the first clock generator 110 receives at the gate terminal of the transistor 430 thereof a chip enable signal (CEB) that has a high logical level, thereby activating the transistor 430. This, as will be described below, enables the first clock generator 110 to generate the global clock signal (GCK) and the data clock signal (DCK). The chip enable signal (CEB) may be generated by auxiliary circuitry external to the semiconductor device 100.

In operation 520, with further reference to FIG. 4, the first clock generator 110 receives at the gate terminal of the transistor 420 thereof an external clock signal (XCLK) that has a low logical level, thereby deactivating the transistor 420. This disconnects the input of the inverter 450 from the electrical ground. The external clock signal (XCLK) may be generated by auxiliary circuitry external to the semiconductor device 100.

In operation 530, with further reference to FIG. 4, the first clock generator 110 receives at the gate terminal of the transistor 410 thereof a reset signal (RESET) that has a low logical level, thereby activating the transistor 410. This connects the input of the inverter 450 to the supply voltage (VDD). The reset signal (RESET) may be generated by the left and right GIOs.

As a result, in operation 540, with further reference to FIG. 4, the first clock generator 110 outputs a global clock signal (GCK) and a data clock signal (DCK) that have a low logical level. The global clock signal (GCK) is received by the local controller (LCTRL). The data clock signal (DCK) is received by the left and right GIOs Thereafter, in operation 550, with further reference to FIG. 4, the first clock generator 110 receives at the gate terminal of the transistor 410 thereof a reset signal (RESET) that has a high logical level, thereby deactivating the transistor 410. This disconnects that input of the inverter 450 from the supply voltage (VDD).

In operation 560, with further reference to FIG. 4, the first clock generator 110 receives at the gate terminal of the transistor 420 thereof an external clock signal (XCLK) that has a high logical level, thereby activating the transistor 420. This connects the input of the inverter 450 to the electrical ground.

As a result, in operation 570, with further reference to FIG. 4, the first clock generator 110 outputs a global clock signal (GCK) and a data clock signal (DCK) that have a high logical level. Operations 520-570 are repeated until the first clock generator 110 receives at the gate terminal of the transistor 430 thereof a chip enable signal (CEB) that has a low logical level. The global control circuit 220 controls writing to and reading from the bit cells 300 through global clock signal (GCK). That is, the global clock signal (GCK) is used in synchronizing the read and write operations on the bit cells 300 by the global control circuit 220. The global control circuit 220 further controls the transfers of data in and out of the semiconductor device 100, e.g., between the bit cells 300 and auxiliary circuitry external to the semiconductor device 100, through the data clock signal (DCK). That is, the data clock signal (DCK) is used in synchronizing the transfer of data to and from the bit cells 300 by the global control circuit 220. Thereafter, the first clock generator 110 may receive at the gate terminal of the transistor 430 thereof a chip enable signal (CEB) that has a low logical level, thereby disabling the first clock generator 110 from generating the global clock signal (GCK) and the data clock signal (DCK).

Figure 6:
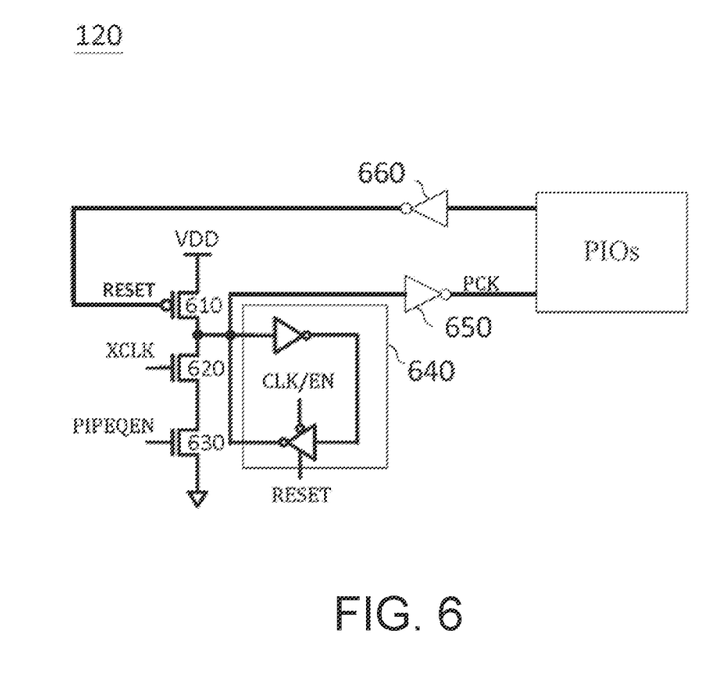
FIG. 6 is a schematic diagram illustrating an exemplary second clock generator in accordance with various embodiments of the present disclosure.

Example supporting circuitry for the second clock generator 120 are depicted in FIG. 6. It is understood that these circuitries are provided by way of example, not by limitation, and other suitable second clock generator 120 circuitry are within the scope of the present disclosure. FIG. 6 is a schematic diagram illustrating an exemplary second clock generator 120 in accordance with various embodiments of the present disclosure. Because the construction and operation of the second clock generator 120 are similar to those described hereinabove in connection with the first clock generator 110, a detailed description of the same will be dispensed with herein for the sake of brevity.

Figure 7:
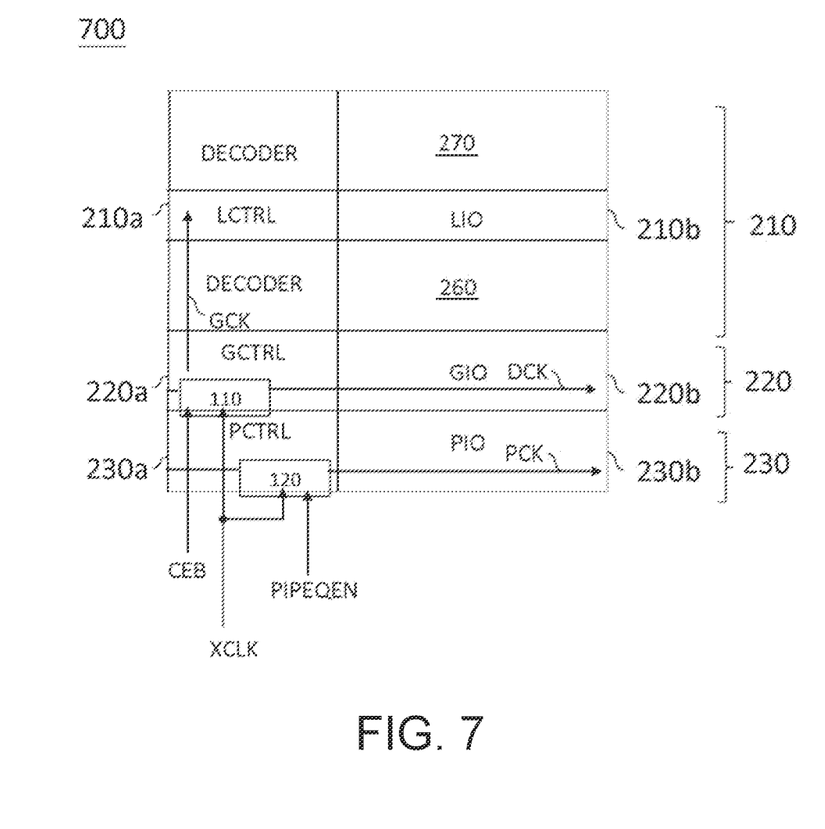
FIG. 7 is a schematic diagram illustrating another exemplary semiconductor device in accordance with various embodiments of the present disclosure.

FIG. 7 is a schematic diagram illustrating another exemplary semiconductor device 700 in accordance with various embodiments of the present disclosure. As illustrated in FIG.

7, the semiconductor device 700 differs from the semiconductor device 100 in that the semiconductor device 700 is dispensed with the memory arrays 240, 250, the left LIO, the left GIO, and the left PIO. That is, the semiconductor device 700 includes the memory arrays 260, 270, the right LIO, the right GIO, and the right PIO. In an alternative embodiment, the semiconductor device 700 is dispensed with the memory arrays 260, 270, the right LIO, the right GIO, and the right PIO. In such an alternative embodiment, the semiconductor device 700 includes the memory arrays 240, 250, the left LIO, the left GIO, and the left PIO. As such, unlike in the previous embodiment, in which read and write operations are performed on memory arrays in both left and right of the semiconductor device 100, in this embodiment, read and write operations are performed on the memory arrays either in the left or right of the semiconductor device 700.

It has thus been shown that the semiconductor device 100, 700 of the present disclosure includes one or more memory banks 210 and first and second clock generators 110, 120. The first clock generator 110 generates a global clock signal (GCK) that controls write and read operations of the semiconductor device 100, 700 and a data clock signal (DCK) that controls transfer of data in and out of the semiconductor device 100, 700. The second clock generator 120 is separate from the first clock generator 110 and generates a pipeline clock signal (PCK) that controls pipeline operation of the semiconductor device 100, 700. Because the first and second clock generators 110, 120 are separate from each other, the first and second clock generators may be enabled/disabled independently of each other. The construction as such reduces the duration of the setup/hold time, as well as the duration of the clock low time. For example, when performing the pipeline operation without the write and read operations, the second clock generator 120 may be enabled, while the first clock generator 110 is disabled. That is, there is no need to wait for the write and read operations to be disabled prior to performing the pipeline operation.

In an embodiment, a semiconductor device comprises a memory bank and first and second clock generators. The first clock generator includes a first transistor configured to receive an external clock signal. The first clock generator is configured to generate a global clock signal that is based on the external clock signal and that controls writing to and reading from the memory bank. The second clock generator includes a first transistor configured to receive the external clock signal. The second clock generator is configured to generate a pipeline clock signal that is based on the external clock signal and that controls a pipeline operation of reading from the memory bank. The first transistor of the second clock generator is different from the first transistor of the first clock generator.

In another embodiment, a semiconductor device comprises a memory bank, a global control circuit, a pipeline control circuit, and first and second clock generators. The memory bank includes a memory array and a local control circuit. The first clock generator is formed in the global control circuit and is configured to generate a global clock signal that is received by the local control circuit and that controls write and read operations on the memory array. The second clock generator is formed in the pipeline control circuit, is separate from the first clock generator, and is configured to generate a pipeline clock signal that controls pipelining of instructions associated with read operations.

In another embodiment, a method comprises enabling a first clock generator to generate a global clock signal, the first clock generator controlling write and read operations on a memory bank of a semiconductor device through the global clock signal, enabling a second clock generator to generate a pipeline clock signal, and the second clock generator controlling pipelining of instructions associated with the read operations through the pipeline clock signal. Enabling the second clock generator to generate the pipeline clock signal is independent of enabling the first clock generator to generate the global clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a memory bank;
   a first clock generator including a first transistor configured to receive an external clock signal, the first clock generator being configured to generate a global clock signal that is based on the external clock signal and that controls writing to and reading from the memory bank; and
   a second clock generator including a first transistor configured to receive the external clock signal, the second clock generator being configured to generate a pipeline clock signal that is based on the external clock signal and that controls a pipeline operation, which simultaneously and respectively fetches and executes next and current instructions associated with reading from the memory bank, wherein the first transistor of the second clock generator is different from the first transistor of the first clock generator.

2. The semiconductor device of claim 1, wherein the first clock generator further includes a second transistor configured to receive a first chip enable signal, the second clock generator further includes a second transistor configured to receive a second chip enable signal, wherein the second transistor of the second clock generator is disconnected from the second transistor of the first clock generator.

3. The semiconductor device of claim 1, wherein the first clock generator further includes a second transistor configured to receive a reset signal, the second clock generator further includes a second transistor configured to receive the reset signal, and the second transistor of the second clock generator is different from the second transistor of the first clock generator.

4. The semiconductor device of claim 1, wherein the first clock generator is further configured to generate a data clock signal that controls transfer of data in and out of the semiconductor device.

5. The semiconductor device of claim 4, further comprising a global control circuit including a global controller formed with the first transistor of the first clock generator and a global input and output (GIO) configured to receive the data clock signal.

6. The semiconductor device of claim 5, wherein the first clock generator further includes an inverter connected to the first transistor thereof and formed in the global controller.

7. The semiconductor device of claim 5, wherein the first clock generator further includes an inverter connected to the first transistor thereof and formed at an edge of the global control circuit.

8. The semiconductor device of claim 1, further comprising a pipeline control circuit including a pipeline controller formed with the first transistor of the second clock generator and a pipeline input and output (PIO) configured to receive the pipeline clock signal.

9. The semiconductor device of claim 8, wherein the second clock generator further includes an inverter connected to the first transistor thereof and formed in the pipeline controller.

10. The semiconductor device of claim 8, wherein the second clock generator further includes an inverter connected to the first transistor thereof and formed at an edge of the pipeline control circuit.

11. A semiconductor device comprising:
a memory bank including a memory array and a local control circuit;
a global control circuit;
a first clock generator formed in the global control circuit and configured to generate a global clock signal that is received by the local control circuit and that controls write and read operations on the memory array;
a pipeline control circuit; and
a second clock generator formed in the pipeline control circuit, separate from the first clock generator, and configured to generate a pipeline clock signal that controls pipelining, which simultaneously and respectively fetches and executes next and current instructions associated with the read operation.

12. The semiconductor device of claim 11, wherein the local control circuit includes a local controller that receives that global clock signal and a local input/output (LIO) that is adjacent the local controller.

13. The semiconductor device of claim 11, wherein the first clock generator is further configured to generate a data clock signal that controls transfer of data in and out of the semiconductor device.

14. The semiconductor device of claim 13, wherein the global control circuit includes a global controller formed with the first clock generator and a global input and output (GIO) configured to receive the data clock signal.

15. The semiconductor device of claim 11, wherein the pipeline control circuit includes a pipeline controller formed with the second clock generator and a pipeline input and output (PIO) configured to receive the pipeline clock signal.

16. A method comprising:
enabling a first clock generator to generate a global clock signal;
the first clock generator controlling write and read operations on a memory bank of a semiconductor device through the global clock signal;
enabling a second clock generator to generate a pipeline clock signal; and
the second clock generator controlling pipelining, which simultaneously and respectively fetches and executes next and current instructions associated with the read operation through the pipeline clock signal, wherein enabling the second clock generator to generate the pipeline clock signal is independent of enabling the first clock generator to generate the global clock signal.

17. The method of claim 16, wherein the semiconductor device comprises a global control circuit including a global controller formed with the first clock generator and a global input and output (GIO) adjacent the global controller.

18. The method of claim 17, further comprising the first clock generator receiving a reset signal from the GIO.

19. The method of claim 16, wherein the semiconductor device comprises a pipeline control circuit including a pipeline controller formed with the second clock generator and a pipeline input and output (PIO) configured to receive the pipeline clock signal.

20. The method of claim 19, further comprising the second clock generator receiving a reset signal from the PIO.

* * * * *